(12) United States Patent
Kenkare et al.

(10) Patent No.: US 7,369,452 B2
(45) Date of Patent: May 6, 2008

(54) PROGRAMMABLE CELL

(75) Inventors: Prashant U. Kenkare, Austin, TX (US); Jeffrey W. Waldrip, Austin, TX (US); Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 160 days.

(21) Appl. No.: 11/400,417

(22) Filed: Apr. 7, 2006

(65) Prior Publication Data

US 2007/0237018 A1    Oct. 11, 2007

(51) Int. Cl.
*G11C 17/18* (2006.01)

(52) U.S. Cl. ............... 365/225.7; 365/188; 365/189.05; 365/214; 365/189.09

(58) Field of Classification Search ............ 365/225.7, 365/188, 189.05, 189.09
See application file for complete search history.

(56) References Cited

U.S. PATENT DOCUMENTS

| | | | |
|---|---|---|---|
| 5,334,880 A | 8/1994 | Abadeer et al. | |
| 6,021,067 A * | 2/2000 | Ha | 365/185.21 |
| 6,172,934 B1 * | 1/2001 | Uchihira | 365/230.06 |
| 6,208,509 B1 | 3/2001 | Cha | |
| 6,236,599 B1 * | 5/2001 | Goto | 365/194 |
| 6,258,700 B1 | 7/2001 | Bohr et al. | |
| 6,373,762 B2 * | 4/2002 | Morgan | 365/201 |
| 6,529,438 B1 * | 3/2003 | Suzuki et al. | 365/230.06 |
| 7,075,848 B2 * | 7/2006 | Choi et al. | 365/225.7 |
| 7,092,306 B2 * | 8/2006 | Lee | 365/225.7 |
| 7,136,303 B2 * | 11/2006 | Smith et al. | 365/185.08 |
| 7,236,418 B2 * | 6/2007 | Uvieghara | 365/225.7 |
| 7,245,546 B2 * | 7/2007 | Uvieghara | 365/225.7 |
| 7,280,397 B2 * | 10/2007 | Scheuerlein | 365/185.08 |

* cited by examiner

*Primary Examiner*—Tuan T. Nguyen

(57) ABSTRACT

A device having an OTP memory is disclosed. A program state of the OTP device is stored at a fuse that is connected in series between a first node and a latch. During a program mode, the first node is electrically connected to a program voltage. During a read mode, the first node is electrically connected to ground, whereby a first divided voltage is generated at a first node of the latch.

20 Claims, 3 Drawing Sheets

PROGRAMMABLE CELL

FIELD OF THE DISCLOSURE

The present disclosure is generally related to storage devices, and more particularly to storage devices having programmable fuses.

BACKGROUND

One-time programmable (OTP) memories are used in a wide variety of integrated circuit devices. OTP memories include non-volatile memory cells that store information used by integrated circuit devices and their applications during operation. For example, an OTP memory can store information used to customize an integrated circuit device. Such uses of OTP memory include trimming an integrated circuit to meet desired operating characteristics, identifying an integrated circuit, enabling redundancy (i.e., memory repair) of an integrated circuit, and other uses. One type of OTP memory cell incorporates a programmable fuse that is blown during programming.

Typical OTP memory cells implement circuitry to program the OTP memory cell, circuitry to sense the state of the OTP memory cell, and separate circuitry to latch the program state for use by the integrated circuit device. However, implementing these operations using separate circuitry can consume an undesirably large area of the integrated circuit. Accordingly, there is a need for an improved OTP memory cell.

DETAILED DESCRIPTION OF THE DRAWINGS

In accordance with one aspect of the present disclosure, an integrated circuit device having a one-time programmable (OTP) memory with OTP memory cells having programmable fuses is disclosed. The OTP memory cells include circuitry to program the state of the fuse, circuitry to sense (read) the state of the fuse, and circuitry to latch a logic value corresponding to the read state of the fuse. In accordance with a specific embodiment, different voltages are applied to a node of the device to program the fuse and to read its state. In addition, transistors incorporated in the OTP memory cell are used to both read the state of the fuse and to latch the sensed state as a logic value. The resulting OTP memory cell consumes less space than conventional OTP memory cells. The present disclosure will be better understood with reference to FIGS. 1-5

Figure 1:
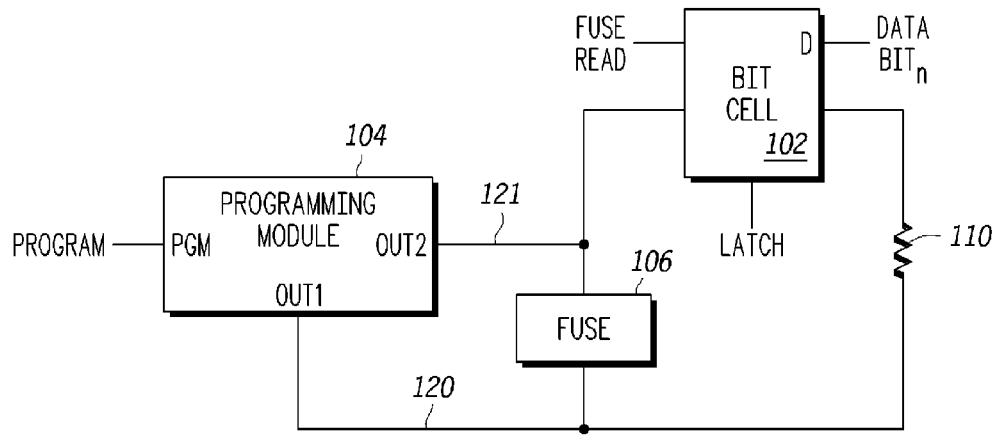
FIG. 1 is a block diagram of a particular embodiment illustrating portions of an integrated circuit device related to an OTP memory cell.

Referring to FIG. 1, a block diagram of a particular embodiment of an OTP memory cell 100 is illustrated. The OTP memory cell 100 includes a bit cell 102, a programming module 104, a fuse 106, and a reference resistor 110.

Bit cell 102 is connected to a first electrode of fuse 106 and to a node (OUT2) of the programming module 104 by a node 121. An output (D) of bit cell 102 provides a signal labeled DATA BITn. A node (OUT1) of programming module 104 is connected to a second electrode of fuse 106 and to a second electrode of reference resistor 110 by a node 120. Bit cell 102 is further connected to other components (not illustrated) to receive a signal labeled FUSE READ and a signal labeled LATCH. The programming module 104 is further connected to other components (not illustrated) to receive a signal labeled PROGRAM.

In one embodiment the fuse 106 is a polysilicon structure that can have its resistive characteristics modified by application of a programming current during a program operation. The polysilicon structure can be silicided. Typically, fuse 106 will have its resistance modified during programming resulting in a higher resistance in its programmed state than in its unprogrammed state. Other structures having a characteristic capable of being modified in a detectable manner by application of a program current or some other signal can be suitable as fuse 106.

During operation, OTP memory cell 100 is operable in three modes of operation: a program mode; a read mode; and a latch mode. During the program mode, the PROGRAM signal is asserted to provide a programming current through fuse 106 to change the state of the fuse from an unprogrammed state to a programmed state. In one embodiment, the unprogrammed state corresponds to a logic value "0", while the programmed state corresponds to a logic value "1". In a specific embodiment, a programming current is generated by providing a program voltage from programming module 104 to node 120 that is larger than a voltage provided from the programming module 104 to node 121. For example, the program voltage at node 120 can be approximately 3 V, while the voltage at node 121 can be approximately ground. The program voltage across fuse 106 is maintained for an amount of time necessary to program fuse 106 to generate a programming current that is approximately proportional to the program voltage. The FUSE READ signal is deasserted during program mode to isolate bit cell circuitry from the program voltage.

During read mode, the PROGRAM signal is deasserted and the FUSE READ signal is asserted. In one embodiment, deasserting the PROGRAM signal results in a tristate condition at OUT2 of programming module 104, thereby electrically isolating node 121 from ground, and electrically connecting node 120 to receive a read voltage that is at or substantially close to ground, through the programming module 104. In response to the FUSE READ signal being asserted, the voltage difference between Vdd and the voltage at node 120, i.e., ground, results in a first current path from Vdd to node 120 that has a set of intervening components that includes fuse 106 and components of bit cell 102. In one embodiment, Vdd is approximately 1.2 V. The voltage division that occurs along the first current path results in a divided voltage occurring at a first node within the bit cell 102 that is based upon the state of fuse 106. A similar voltage division occurs along a second current path between Vdd and node 120 that includes resistor 110, and generates a divided voltage at a second node of bit cell 102, thereby reading (sensing) the program state of fuse 106. When the LATCH signal is asserted during latch mode, the divided voltages representative of the program state are converted to logic level voltages. For example, if the fuse 106 is in an unprogrammed state, the first divided voltage representative of the unprogrammed state of fuse 106 will be lower than for a programmed state. For example, the divided voltage at the first node of bit cell 102 can be approximately 0.1 V for an unprogrammed state and approximate 0.7 V for a programmed state. It will be appreciated that the second divided voltage can be compared to the first divided voltage at the bit cell 102 to latch the logic state. The logic state remains latched as long as the LATCH signal remains asserted, thereby allowing the logic value representing the program state of fuse 106 to remain available at output D of bit cell 102. The bit cell 102 uses some of the same components to read the fuse 106 as it uses to latch the logic value. Because some of the same components are used to read the fuse and latch the logic value, the size of the OTP memory cell 100 can be reduced over other OTP memory cells.

Figure 2:
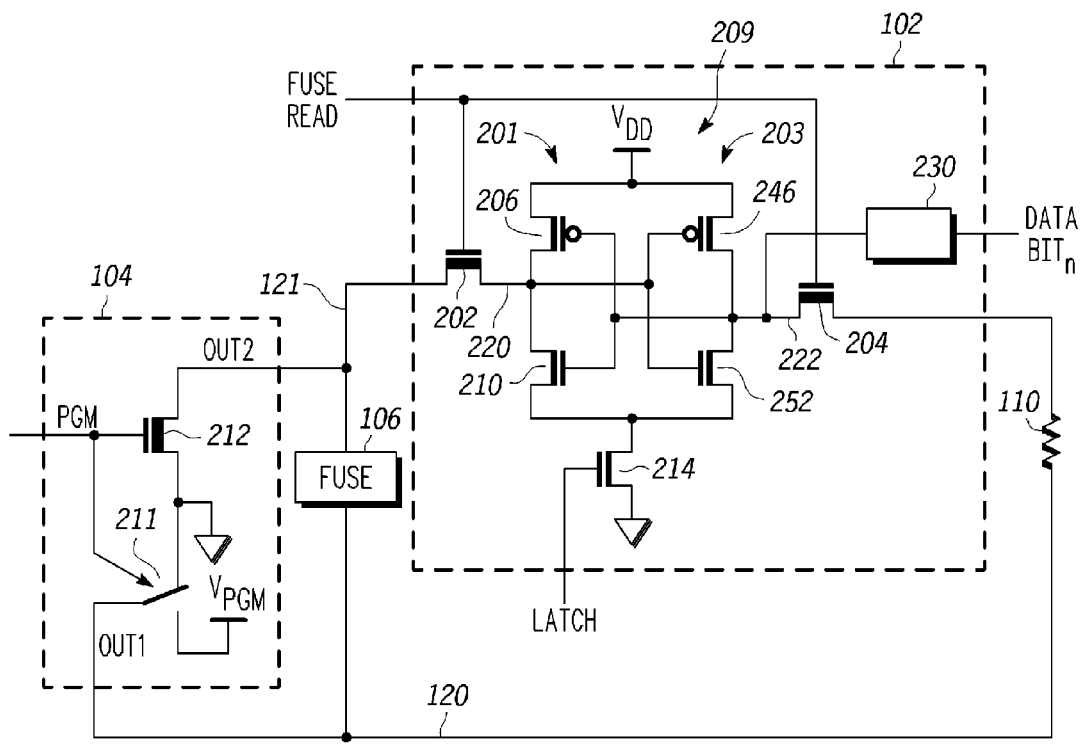
FIG. 2 is a block diagram illustrating portions of the OTP memory cell of FIG. 1 in greater detail.

FIG. 2 illustrates a particular embodiment of OTP memory cell 100. The bit cell 102 illustrated in greater detail in FIG. 2 includes: a pass gate 202 having a first current electrode, a second current electrode connected to a first electrode of fuse 106, and a control electrode connected to receive a FUSE READ signal; a pass gate 204 having a first current electrode, a second current electrode connected to a first electrode of resistor 110, and a control electrode connected to receive the FUSE READ signal; and a latch 209 having a first input connected to a first current electrode of a pass gate 202, a second input connected to a first current electrode of a pass gate 204, and a control input connected to receive a LATCH signal.

The latch 209 of FIG. 2 has an inverter 201 cross-coupled with an inverter 203, and a transistor 214. Inverter 201 includes: a transistor 206 having a first current electrode connected to Vdd, a second current electrode connected to the first current electrode of pass gate 202, and a control gate connected to the first current electrode of pass gate 204; and a transistor 210 having a first current electrode connected to the second current electrode of transistor 206, a second current electrode, and a control electrode connected to the control electrode of transistor 206. Inverter 203 includes: a transistor 246 having a first current electrode connected to Vdd, a second current electrode coupled to the control gate of transistor 206, and a control gate coupled to the second current electrode of transistor 206; and a transistor 252 having a first current electrode coupled to the second current electrode of transistor 246, a second current electrode connected to the second current electrode of transistor 210, and a control electrode coupled to the control electrode of transistor 246. Transistor 214 has a first current electrode connected to the second current electrode of transistor 210, a second current electrode connected to ground, and a control electrode to receive a LATCH signal.

Note that the gate electrodes of pass gate 202 and pass gate 204 are illustrated as being thicker than the gate electrodes of the transistors of latch 209 of similar conductivity type to indicate that pass gate 202 and pass gate 204 have thick gate dielectrics as compared to other transistors of FIG. 2 that are not drawn with thick gate electrodes. Transistors with the thicker dielectrics are capable of being exposed to a maximum gate voltage that is larger than the maximum gate voltage of the transistors of latch 209 that are normal transistors having gate dielectrics that are thinner than the gate dielectrics of the pass gate 202 and pass gate 204.

The programming module 104 of FIG. 2 includes: a transistor 212 having a first current electrode connected to the first electrode of fuse 106, a second current electrode connected to ground, and a control electrode connected to receive the PROGRAM signal; a switch 211 having a first selectable current electrode connected to ground, a second selectable current electrode connected to a programming voltage reference (VPGM), a fixed current electrode connected to node 120, and a control electrode connected to receive the PROGRAM signal.

The resistor 110 provides a reference resistance at bit cell 102. In one embodiment the resistor 110 includes a plurality of unprogrammed fuses similar to fuse 106 connected in series, and thereby has a resistance that is an integer multiple of the resistance of a single fuse 106.

During program mode, the FUSE READ signal is deasserted and PROGRAM SIGNAL is asserted. Deasserting the FUSE READ signal disables pass gate 202 and pass gate 204, thereby preventing current from flowing to latch 209 and isolating the transistors of latch 209 from the programming voltage at node 120, which is higher than Vdd. By asserting the PROGRAM signal, the first electrode of fuse 106 is electrically connected to ground through transistor 212, which also has a thick gate dielectric, while the second electrode of fuse 106 is connected to the program voltage $V_{PGM}$ at node 120, through switch 211. Note switch 211 typically includes transistors also having thick gate dielectrics. By enabling transistor 212 and switch 211 a program current will flow through fuse 106.

During read mode, the PROGRAM signal is deasserted. This disables transistor 212 resulting in node 121 being electrically isolated from ground, and controls switch 211 in a manner that electrically connects node 120 to ground. Disabling transistor 212 results in node 121 being electrically isolated from ground. The FUSE READ signal is asserted to enable the pass gate 202 and the pass gate 204 to allow the state of fuse 106 to be read. Reading of the fuse 106 occurs because the voltage between the Vdd node and node 120 is divided amongst components along a first current path of the OTP memory cell 100. As a result, a portion of the total voltage drop will occur across each of transistor 206, pass gate 202, and fuse 106. This results in a first divided voltage at node 220, which is a storage node of latch 209. The voltage between the Vdd node and node 120 is similarly divided along a second current path that includes transistor 246, pass gate 204, and reference resistor 110 to provide a second divided voltage at node 222, which is a second storage node of latch 209. In one embodiment, when fuse 106 is unprogrammed, the divided voltage at node 220 is approximately 0.1 V and the divided voltage at node 222 is approximately 0.3 V. Alternatively, when fuse 106 is programmed, the divided voltage at node 220 is approximately 0.7 V and the divided voltage at node 222 is approximately 0.1 V. Note when fuse 106 is unprogrammed, the divided voltage at node 222 is substantially less than the voltage at which it will be latched. A voltage at node 222 that is substantially less than the voltage at which it will be latched would include a voltage at node 222 that is less than 90% of Vdd. In the illustrated embodiment, the divided voltage at node 222 is less than one-half of Vdd. For example, the divided voltage at node 222 can be approximately 0.3 V and will be latched at 1.2 V. Therefore in this embodiment, the divided voltage signal at node 222 is at a voltage that is approximately one-fourth of the voltage of the logic signal at which it will be latched.

During latch mode, the LATCH signal is asserted and the FUSE READ signal is deasserted. In one embodiment, this results in transistor 214 being enabled shortly before pass gate 202 and pass gate 204 are disabled. Enabling latch gate 214 and disabling the pass gates results in the divided voltages at node 220 and node 222 transitioning to Vdd and ground, respectively, when the divided voltage at node 220 is greater than the divided voltage at node 222, or, alternatively, transitioning to ground and Vdd, respectively, when the divided voltage at node 220 is less than the divided voltage at node 222. These logic values remain latched as long as the LATCH signal is enabled. A buffer 230 has an input connected to at least one of nodes 220 and 222 to provide a logic signal (DATA BITn) from the memory cell 100 representing the state of the fuse.

The memory cell 100 is an efficient implementation in that portions of the latch 202 are used to sense a state of fuse 106 as well as to latch a representation of the state of fuse 106, thereby reducing the number of components used in other memory cell implementations using programmable fuses.

Figure 3:
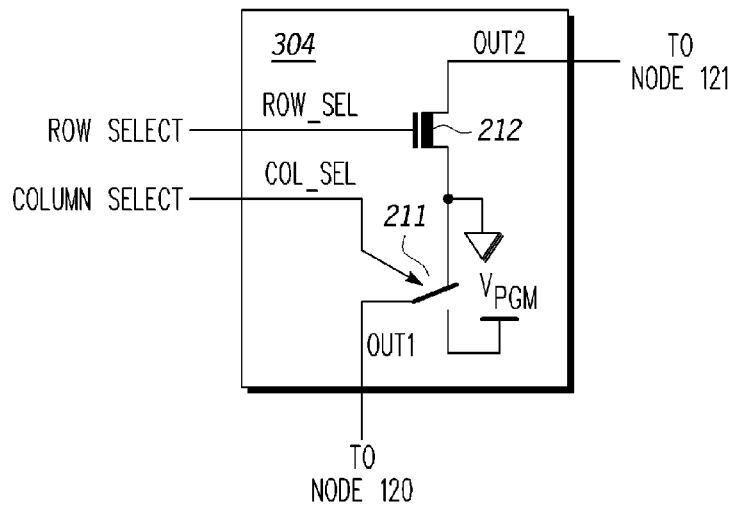
FIG. 3 is a block diagram illustrating an alternate embodiment of a portion of the block diagram of the OTP memory cell of FIG. 1 in greater detail.

FIG. 3 illustrates an alternate implementation of a programming module 304 that can be used in place of programming module 104 described in FIG. 1 and FIG. 2. In FIG. 3, transistor 212 and switch 211 of FIG. 2 are shown, but are connected differently than in the programming module 104 described at FIG. 2. Specifically, switch 211 has a control electrode labeled COL_SEL that is controlled by a control signal labeled COLUMN SELECT, and the transistor 212 has a control electrode labeled ROW_SEL that is controlled by a control signal labeled ROW SELECT. In operation, a fuse associated with an OTP memory cell having programming module 304 will be programmed only when both transistor 212 and switch 211 are enabled by asserting ROW SELECT and COLUMN SELECT signals. The OTP memory cells 333 of the OTP memory bank 300 illustrated in FIG. 4 provide row and column select signals and can, therefore, utilize OTP memory cells having programming module 304 as illustrated in FIG. 3.

Figure 4:
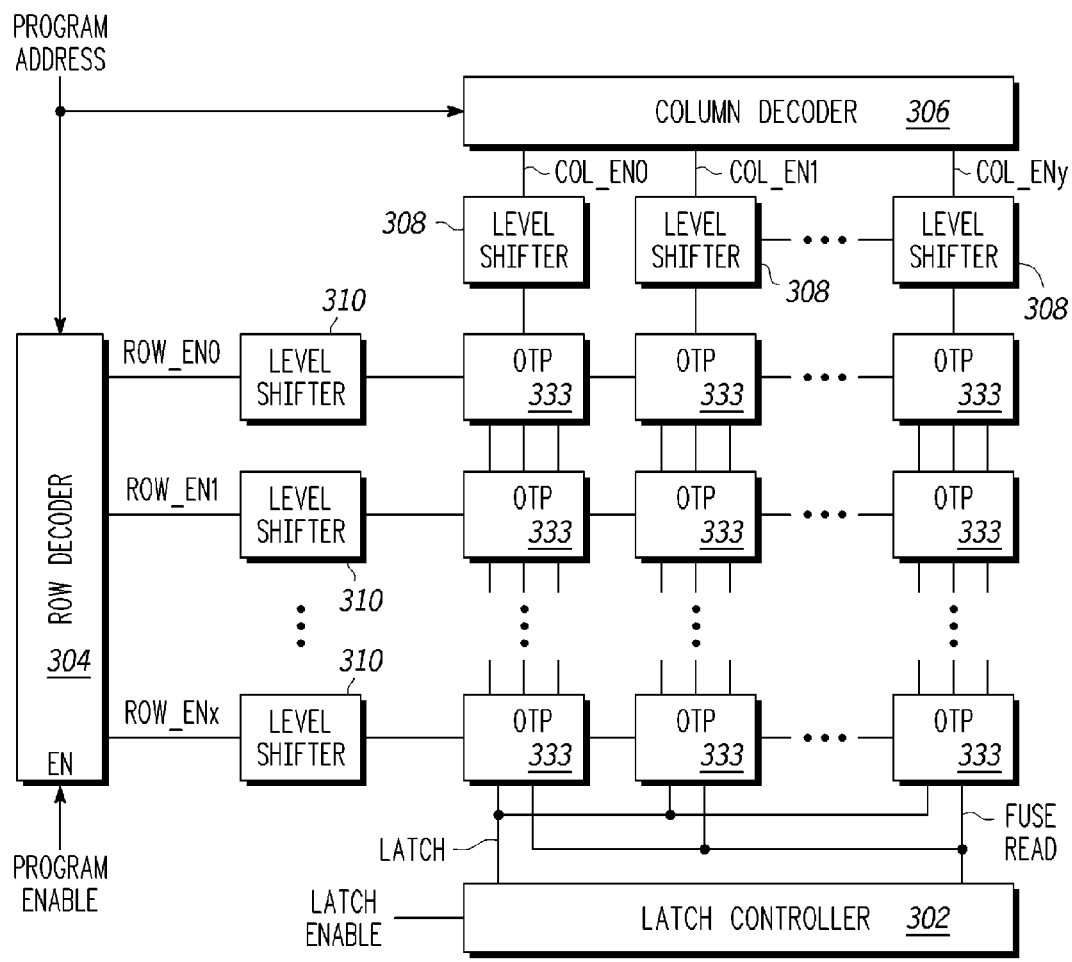
FIG. 4 is a block diagram of a particular embodiment of a portion of an integrated circuit device having an array of OTP memory cells.

Referring to FIG. 4, an OTP memory bank 300 is illustrated. The OTP memory bank 300 includes a latch controller 302, a row decoder 304, a column decoder 306, a first set of level shifters 310, a second set of level shifters 308, and an array of OTP memory cells 333.

During program mode, PROGRAM ENABLE signal is asserted, LATCH ENABLE signal is deasserted, and specific OTP memory cell 333 is identified by a value of the PROGRAM ADDRESS signal. The specific OTP memory cell 333 is selected for programming when both its row enable signal (ROW_EN) and its column enable signal (COL_EN) are asserted in response to an address (PROGRAM ADDRESS) being decoded. The asserted row enable signal causes a corresponding one of the first set of level shifters 310 to provide an asserted control signal to each OTP memory cell 333 in the selected row. Note the first set of level shifters is used to provide a voltage capable of driving transistors having thick dielectric gates as previously described. The asserted row enable signal will cause transistor 212 of each OTP memory cell 333 in the selected row to be enabled, thereby electrically connecting one electrode of each corresponding programmable fuse 106 to ground. The asserted column enable signal will cause corresponding one of the second set of level shifters 308 to provide an asserted control signal to each OTP memory cell 333 in the selected column, which includes one OTP memory cell 333 in the selected row. Each OTP memory cell 333 receiving the asserted column enable signal will have its switch 211 enabled to connect its corresponding node 120 to the programming voltage. This will cause a programming current to flow through the fuse 106 of the selected OTP memory cell 333. Note that each OTP memory cell 333 of the selected column that is in an unselected row is prohibited from generating a programming current because its corresponding transistor 212 remains off. The OTP memory cells 333 in the selected row that receive a deasserted column enable signal maintain their node 120 at ground, thereby preventing the programmable fuse from being programmed.

Latch controller 302 can implement both read mode and latch mode at the OTP memory bank 300 in response to the PROGRAM ENABLE signal being deasserted and LATCH ENABLE being asserted. In one embodiment, each OTP memory cell 333 is read and its data latched from a common set of control signals. For example, in response to being enabled when the PROGRAM ENABLE signal is deasserted, the latch controller 302 can assert the FUSE READ signal at each OTP memory cell 333 simultaneously, to allow each OTP memory cell 333 to sense the state of its corresponding fuse. Prior to deasserting the FUSE READ signal, the latch controller 302 can assert the LATCH signal at each OTP memory cell 333 simultaneously to latch logic values at each OTP memory cell 333 corresponding to its sensed state, as previously described herein. The latched logic value of each OTP memory cell 333 in FIG. 4 is provided to the device that includes OTP memory bank 300, which will typically include a data processor.

Figure 5:
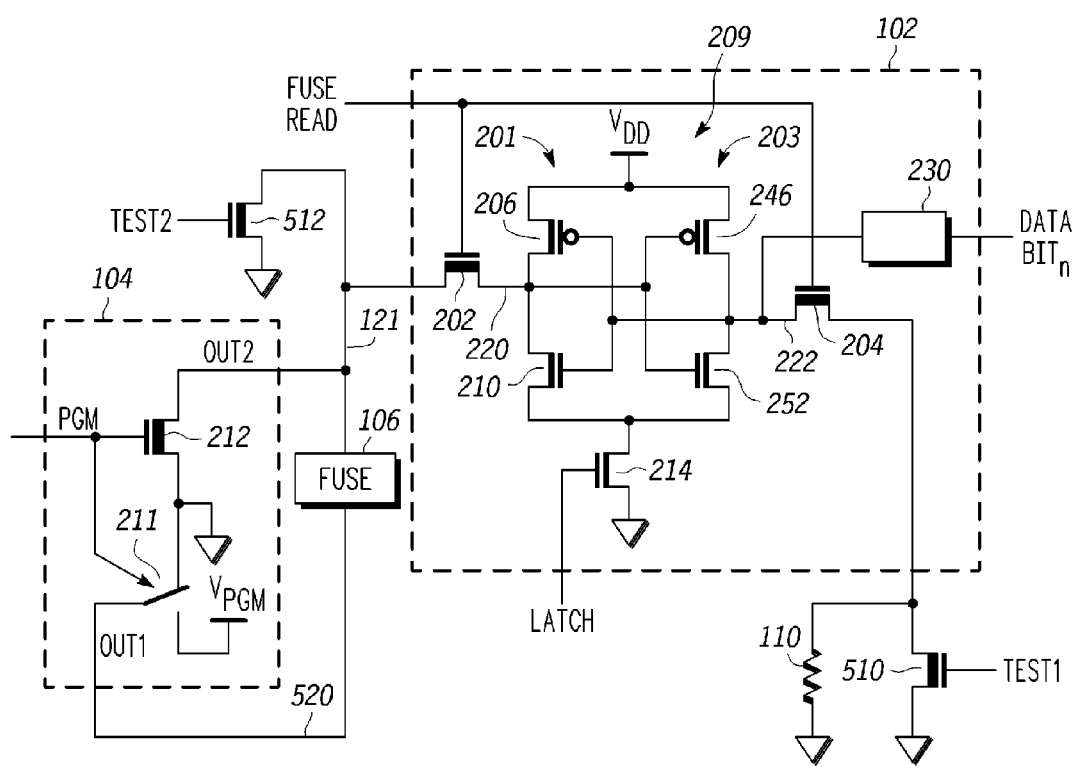
FIG. 5 illustrates the block diagram of FIG. 2 with additional test features.

FIG. 5 illustrates a similar embodiment of OTP memory cell of FIG. 2 with additional NMOS transistors 510 and 512, having thick gate dielectrics, that can be used to evaluate operating margins and for debug purposes. Transistor 510 has a first current electrode connected to the first current electrode of resistor 110, a second current electrode connected to ground, and a control electrode connected to receive a signal labeled TEST1. Transistor 512 has a first current electrode connected to the first current electrode of fuse 106, a second current electrode connected to ground, and a control electrode connected to receive a signal labeled TEST2. During operation, transistor 510 and transistor 512 can be biased by signals TEST 1 and TEST2, respectively, to generate various voltages at their drains that simulate likely operating conditions. In addition, the OTP memory cell of FIG. 5 differs from the OTP memory cell of FIG. 2 in that the resistor 110 is connected to ground in FIG. 5.

The present disclosure identifies various aspects. In a first aspect, the method includes receiving a program voltage at a first node during a program mode, and receiving a read voltage at the first node during a read mode, wherein the read voltage is different than the program voltage. The method can further include, during the read mode, dividing a first voltage between the first node and a first current electrode of a first transistor of a bit cell to generate a first divided voltage at a second node, wherein the first current electrode and a second current electrode of the first transistor are coupled in series between a voltage reference node and the second node, and a programmable fuse is coupled in series between the first node and the second node.

One specific aspect further includes a first logic value is latched at the second current electrode of the first transistor based upon the first divided voltage. A more specific aspect further includes, during the read mode, dividing a second voltage between the first node and a first current electrode of a second transistor of the bit cell to generate a second divided voltage at a third node, wherein the first current electrode and a second current electrode of the second transistor are coupled in series between the voltage reference node and the third node, and a reference resistance is coupled in series between the first node and the third node. A yet more specific aspect includes latching a second logic value at the second current electrode of the second transistor based upon the second divided voltage, wherein the first logic value and the second logic value are complementary values. The second divided voltage can be substantially less than a voltage of the second logic value.

In another specific aspect, during the read mode, a second voltage is divided between the first node and a first current electrode of a second transistor of the bit cell to generate a second divided voltage at a third node, wherein the first current electrode and a second current electrode of the second transistor are coupled in series between the voltage reference node and the third node, and a reference resistance is coupled in series between the first node and the third node. The reference resistance can be approximately an integer multiple of a resistance of the programmable fuse. A more specific aspect includes dividing the first voltage comprises providing a first portion of the first voltage across the first transistor, a second portion of the first voltage across the programmable fuse, and a third portion of the first voltage across a first pass gate, wherein a first current electrode of the first pass gate and a second current electrode of the first pass gate are coupled in series between the second node and a first electrode of the programmable fuse. In a yet more specific aspect, a sum of the first portion of the first voltage across the first transistor, the second portion of the first voltage across the programmable fuse, and the third portion of the first voltage across the first pass gate is substantially equal to the first voltage. In another yet more specific aspect, dividing the second voltage comprises providing a first portion of the second voltage across the second transistor, a second portion of the second voltage across the reference resistance, and a third portion of the second voltage across a second pass gate, wherein a first current electrode of the second pass gate and a second current electrode of the second pass gate are coupled in series between the third node and a first electrode of the reference resistance. In yet still another specific aspect, a sum of the first portion of the first voltage across the second transistor, the second portion of the first voltage across the reference resistance, and the third portion of the first voltage across a second-pass gate is substantially equal to the second voltage.

In another specific aspect, during the read mode, dividing the first voltage to generate a second divided voltage at a third node, wherein a first current electrode and a second current electrode of a second transistor of the bit cell are coupled in series between the third node and the first current electrode of the first transistor, and a reference resistance is coupled in series between the first node and the third node.

In another specific aspect, during the program mode, programming the programmable fuse by supplying a program current through the programmable fuse, wherein the program current is approximately proportional to the program voltage. In a more specific aspect, programming further comprises electrically isolating the second node from the first node when supplying the program current through the programmable fuse. In yet another specific aspect, electrically isolating comprises electrically isolating the second node from the first node through a pass gate. In still yet another specific aspect, a transistor of the pass gate comprises a first maximum gate voltage that is greater than a second maximum gate voltage of a second transistor of the bit cell, wherein the second transistor and the transistor of the pass gate are of a common conductivity type.

The above-disclosed subject matter is to be considered illustrative, and not restrictive, and the appended claims are intended to cover all such modifications, enhancements, and other embodiments that fall within the true spirit and scope of the present invention. Therefore, the disclosure has been described with reference to specific embodiments. However, it will be appreciated that various modifications and changes can be made without departing from the scope of the present disclosure as set forth in the claims below. For example: during latch mode the read data can be latched by asserting the LATCH signal simultaneously, or prior to deasserting the FUSE READ signal; OTP memory banks that can program multiple OTP memory cells simultaneously are envisioned, as are OTP memory banks that latch rows of OTP memory cells separately; other ways of implementing row and column selectable OTP memory cells are anticipated, such as connecting inputs of a logic gate to row and column select signals, and connecting the output of the logic gate to the gate of transistor 212; the term pass gate is understood to be a term of art generally referring to a switch having one or more transistors, though the disclosed pass gates herein are illustrated as being a single transistor; other voltages than those disclosed are anticipated. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method comprising:
   receiving a program voltage at a first node during a program mode;
   receiving a read voltage at the first node during a read mode, wherein the read voltage is different than the program voltage; and
   during the read mode, dividing a first voltage between the first node and a first current electrode of a first transistor of a bit cell to generate a first divided voltage at a second node, wherein the first current electrode and a second current electrode of the first transistor are coupled in series between a voltage reference node and the second node, and a programmable fuse is coupled in series between the first node and the second node.

2. The method of claim 1 further comprising:
   latching a first logic value at the second current electrode of the first transistor based upon the first divided voltage.

3. The method of claim 2 further comprising:
   during the read mode, dividing a second voltage between the first node and a first current electrode of a second transistor of the bit cell to generate a second divided voltage at a third node, wherein the first current electrode and a second current electrode of the second transistor are coupled in series between the voltage reference node and the third node, and a reference resistance is coupled in series between the first node and the third node.

4. The method of claim 3 further comprising:
   latching a second logic value at the second current electrode of the second transistor based upon the second divided voltage, wherein the first logic value and the second logic value are complementary values.

5. The method of claim 4 wherein the second divided voltage is substantially less than a voltage of the second logic value.

6. The method of claim 1 further comprising:

during the read mode, dividing a second voltage between the first node and a first current electrode of a second transistor of the bit cell to generate a second divided voltage at a third node, wherein the first current electrode and a second current electrode of the second transistor are coupled in series between the voltage reference node and the third node, and a reference resistance is coupled in series between the first node and the third node.

7. The method of claim 6, wherein dividing the first voltage comprises providing a first portion of the first voltage across the first transistor, a second portion of the first voltage across the programmable fuse, and a third portion of the first voltage across a first pass gate, wherein a first current electrode of the first pass gate and a second current electrode of the first pass gate are coupled in series between the second node and a first electrode of the programmable fuse, and wherein a sum of the first portion of the first voltage across the first transistor, the second portion of the first voltage across the programmable fuse, and the third portion of the first voltage across the first pass gate is substantially equal to the first voltage.

8. The method of claim 1 further comprising:

during the read mode, dividing the first voltage to generate a second divided voltage at a third node, wherein a first current electrode and a second current electrode of a second transistor of the bit cell are coupled in series between the third node and the first current electrode of the first transistor, and a reference resistance is coupled in series between the first node and the third node.

9. The method of claim 1 further comprising:

during the program mode, programming the programmable fuse by supplying a program current through the programmable fuse, wherein the program current is approximately proportional to the program voltage.

10. The method of claim 9, wherein programming further comprises electrically isolating the second node from the first node when supplying the program current through the programmable fuse.

11. The method of claim 10, wherein electrically isolating comprises electrically isolating the second node from the first node through a pass gate.

12. The method of claim 11, wherein a transistor of the pass gate comprises a first maximum gate voltage that is greater than a second maximum gate voltage of a second transistor of the bit cell, wherein the second transistor and the transistor of the pass gate are of a common conductivity type.

13. The method of claim 1 wherein the read voltage is approximately equal to ground.

14. A device comprising:

a bit cell comprising:

a latching device comprising a first transistor comprising a first current electrode, a second current electrode, and a control electrode, wherein the latching device is operable to latch data at the second current electrode;

a pass gate comprising a first current electrode coupled to the second current electrode of the first transistor, a second current electrode, and a control electrode;

a programmable fuse comprising a first electrode coupled to the second electrode of the pass gate, and a second electrode;

a second transistor comprising a first electrode coupled to a voltage reference node, a second electrode coupled to the first electrode of the programmable fuse, and a control electrode, wherein the second transistor is enabled to program the programmable fuse;

a first control module comprising a first output coupled to the second electrode of the programmable fuse to provide a first voltage relative to a voltage at the voltage reference node when programming the programmable fuse, and to provide a second voltage relative to the voltage at the voltage reference node when reading a state of the fuse.

15. The device of claim 14 further comprising:

a second control module comprising a first output coupled to the control electrode of the pass gate to activate the pass gate when determining a program state of the programmable fuse, and to deactivate the pass gate when programming the programmable fuse.

16. The device of claim 14, wherein:

the latching device comprises a second transistor comprising a first electrode coupled to the second electrode of the first transistor, wherein the second transistor and a transistor of the pass gate have a common conductivity type, and a gate dielectric of the transistor of the pass gate is substantially thicker than a gate dielectric of the second transistor.

17. The device of claim 14, wherein the bit cell further comprises:

a second pass gate comprising a first current electrode coupled to the control gate of the first transistor, a second current electrode, and a control gate coupled to the control gate of the first pass gate; and a resistor comprising a first electrode coupled to the second electrode of the second pass gate, and a second electrode.

18. The device of claim 17, wherein the second electrode of the resistor is further coupled to the second electrode of the programmable fuse.

19. The device of claim 14, wherein the latching device further comprises:

a third transistor comprising a first current electrode coupled to the second current electrode of the first transistor, a second electrode, and a control electrode coupled to the control electrode of the first transistor; and a fourth transistor comprising a first current electrode coupled to second electrode of the third transistor, a second electrode, and a control electrode coupled to receive a signal to latch the data at the second current electrode of the first transistor.

20. The device of claim 14, wherein the bit cell is one of a plurality of bit cells of a memory array, each bit cell of the memory array comprising a corresponding programmable fuse.

* * * * *